(12) United States Patent
Hickman et al.

(10) Patent No.: US 7,408,406 B2
(45) Date of Patent: Aug. 5, 2008

(54) MODE SELECTION AMPLIFIER CIRCUIT USABLE IN A SIGNAL ACQUISITION PROBE

(75) Inventors: Barton T. Hickman, Portland, OR (US); Richard J. Huard, Beaverton, OR (US); Einar O. Traa, Portland, OR (US)

(73) Assignee: Tektronix, Inc., Beaverton, OR (US)

( * ) Notice: Subject to any disclaimer, the term of this patent is extended or adjusted under 35 U.S.C. 154(b) by 213 days.

(21) Appl. No.: 11/441,748

(22) Filed: May 24, 2006

(65) Prior Publication Data

US 2007/0273438 A1 Nov. 29, 2007

(51) Int. Cl.
*H03F 3/45* (2006.01)
(52) U.S. Cl. .......................................... 330/69; 330/147
(58) Field of Classification Search ................ 330/51, 330/69, 147; 327/355, 403, 404, 407, 408
See application file for complete search history.

(56) References Cited

U.S. PATENT DOCUMENTS

| | | | |
|---|---|---|---|
| 3,512,084 A | 5/1970 | Roberts et al. | |
| 4,591,740 A | 5/1986 | Anderson et al. | |
| 4,683,441 A * | 7/1987 | Naylor | 330/69 |
| 5,272,449 A | 12/1993 | Izawa | |
| 5,977,828 A | 11/1999 | Hu | |
| 5,982,230 A * | 11/1999 | MacBeth | 330/9 |
| 6,639,397 B2 | 10/2003 | Roth et al. | |
| 2005/0114047 A1 | 5/2005 | McTigue | |
| 2006/0022741 A1* | 2/2006 | Hopkins | 327/407 |

OTHER PUBLICATIONS

"Handbook of Analog Circuit Design", Dennis L. Feucht, Copyright 1990, Academic Press, Inc., book page, Fig. 10.56.

* cited by examiner

*Primary Examiner*—Marvin Lateef
*Assistant Examiner*—Khiem D Nguyen
(74) *Attorney, Agent, or Firm*—William E. Bucher

(57) ABSTRACT

A mode selection amplifier circuit has multiple differential amplifier circuits coupled to receive input signals A, B and C. Each differential amplifier circuit is selectively operable for generating a signal output representative of an output mode with the output mode of each differential amplifier circuit selected from one of algebraic combinations of the signal inputs A–C, B–C, A–B and (A+B)/2–C. The mode selection amplifier circuit is usable in a signal acquisition probe for providing various signal output modes to a measurement test instrument.

28 Claims, 8 Drawing Sheets

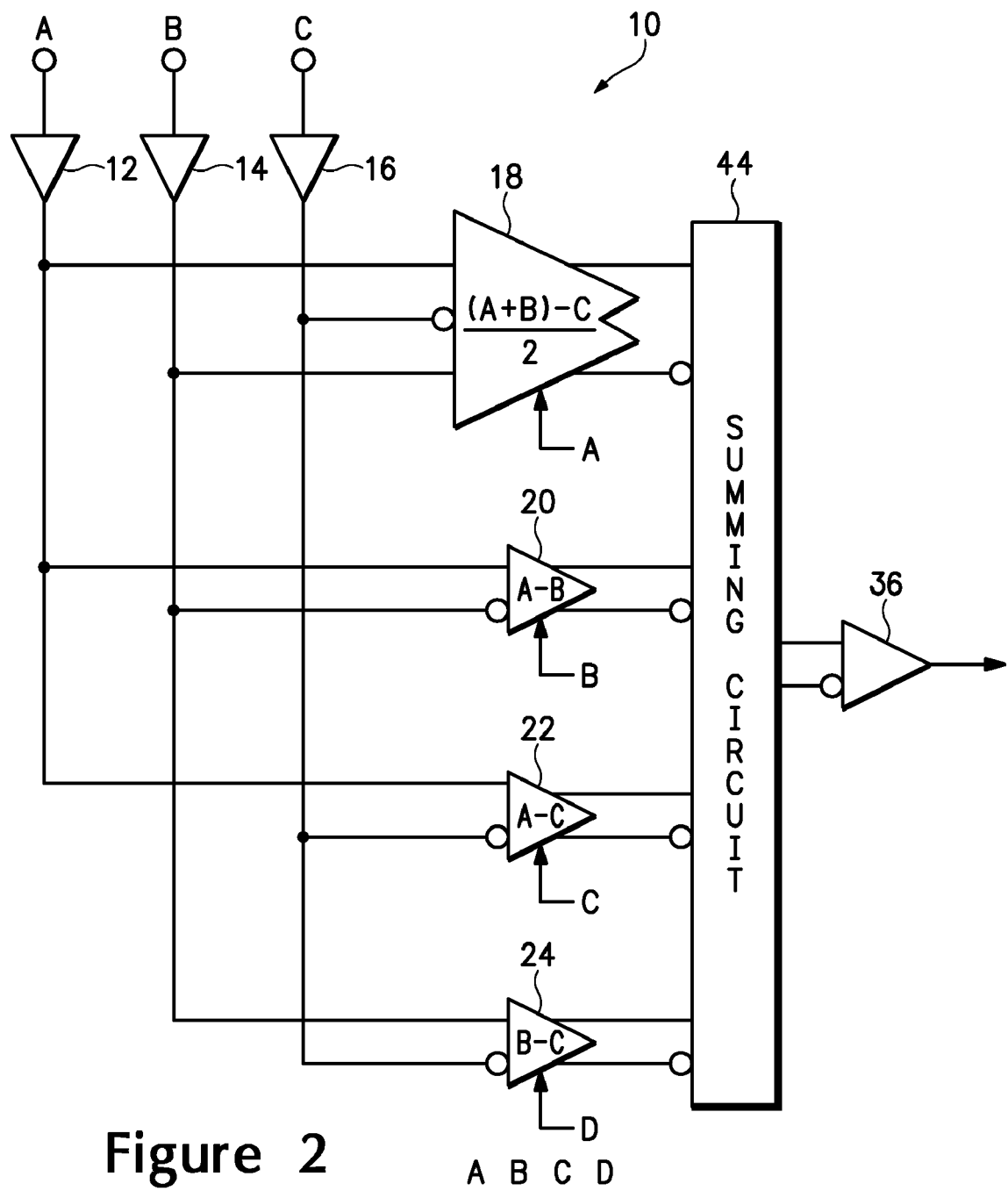
Figure 2
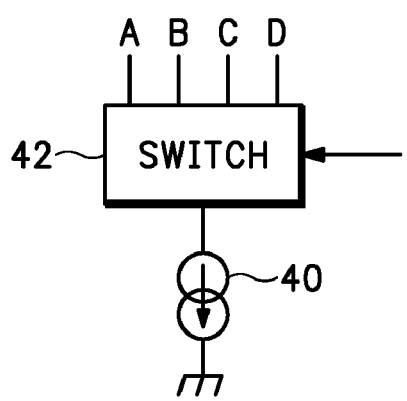

MODE SELECTION AMPLIFIER CIRCUIT USABLE IN A SIGNAL ACQUISITION PROBE

BACKGROUND OF THE INVENTION

The present invention relates generally to amplifier circuits and more particularly to a mode selection amplifier circuit usable in a signal acquisition probe.

Signal acquisition probes acquire various types of electrical signals from a device under test. Generally, electrical signals may be divided into single ended signals and differential signals. The single ended signal is carried on a signal conductor that has an associated reference, generally electrical ground. The differential signal is carried on a pair of signal conductors with the differential signal having two electrical signal components.

Single ended and differential voltage signal acquisition probes are manufactured to measure the respective single ended and differential signals. The voltage single ended signal acquisition probe has a probing tip for contacting a test point on a device under test carrying the single ended signal. A ground contact or lead extends from the signal acquisition probe for connecting to a ground reference associated with the signal ended signal. For single ended active voltage probes, the probing tip is electrically coupled to buffer amplifier via an attenuator circuit. The buffer amplifier isolates the signal from loading by the probe cable and provides a controlled impedance output. The output of the buffer amplifier is coupled to a probe signal cable which generally has a 50 ohm impedance characteristic. The other end of the cable is coupled to a measurement test instrument, such as an oscilloscope or the like, via a probe control box for displaying a representation of the signal on a display device of the oscilloscope.

The differential voltage signal acquisition probe has dual probing tips for contacting test points on the device under test carrying the differential signal. The dual probing tips are coupled to inputs of a differential amplifier via a dual attenuator circuit. The differential amplifier generates an output that is proportional to the differential signal. The output of the differential amplifier is coupled to a probe signal cable which generally has a 50 ohm characteristic impedance. The other end of the cable is coupled to measurement test instrument, such as an oscilloscope or the like, via a probe control box for displaying a representation of the difference of the signal components of the differential signal on a display device of the oscilloscope.

The differential signal has common mode components that are measured with two single ended voltage signal acquisition probes. The probing tip of one of the single ended voltage signal acquisition probe is coupled to one of the signal components of the differential signal and the probing tip of the other single ended voltage signal acquisition probe is coupled to the other signal component of the differential signal. Each signal acquisition probe is coupled to separate signal input channels of the oscilloscope where the oscilloscope sums the signal components and divides the summed result by 2 to generate a common mode signal result. The common mode signal result is displayed on the display device of the oscilloscope.

Measuring the common mode voltage of a differential signal using two single ended signal acquisition probes has a number of drawbacks. Gain or delay mismatches between the probes can cause inaccuracies in the common mode measurement. To reduce these delays, the probes need to be deskewed so as to align the signal from one probe with the other. This requires the use of a deskew fixture and algorithms within the measurement test instrument for aligning the signals from the deskew fixture. Any internal delays in the instrument that have not been calibrated out of the signal channels will affect the common mode measurement.

What is needed is an amplifier circuit within the signal acquisition probe that permits the selection of various measurement modes. The amplifier circuit should be able to receive voltage signals that are referenced to a reference source, such as electrical ground, and differential voltage signals and generate various signal output modes that include differential and common mode signal outputs as well as voltage signals referenced to a reference source. The amplifier circuit should be usable in a signal acquisition probe configurable as both a single ended and a differential signal acquisition probe.

SUMMARY OF THE INVENTION

The above needs are met with a mode selection amplifier circuit having multiple differential signal output modes. The mode selection amplifier circuit has multiple differential amplifier circuits coupled to signal inputs A, B and C. Each differential amplifier circuit is selectively operable for generating a signal output representative of an output mode with the output mode of each differential amplifier circuit selected from one of algebraic combinations of the signal inputs A–C, B–C, A–B and (A+B)/2–C.

The mode selection amplifier circuit preferably includes a switching circuit having an input coupled to at least a first current source and multiple outputs with each output coupled to one of the differential amplifier circuits. The switching circuit selectively couples the current source to each of the differential amplifier circuits for operating each of the multiple differential amplifier circuits independent of the other differential amplifier circuits. In the preferred embodiment, the switching circuit is a switch matrix having first and second switching elements with each switching element coupled to a constant current source and having multiple outputs. Each of the outputs are coupled to one of the multiple differential amplifiers. The switching circuit may be implemented with a demultiplexer circuit.

The mode selection amplifier circuit may also be implemented with a summing circuit coupled to receive the signal outputs of the differential amplifier circuits representing the various output modes. The summing circuit generates a summed signal output representing the selected output mode of the differential amplifier circuits.

An output amplifier receives either the signal outputs of each of the differential amplifier circuits or the summed signal output of the summing circuit and generates an output signal representative of the selected output mode of the differential amplifier circuits. The output amplifier may generate a differential or single ended output signal equivalent to and representative of the selected output mode of the differential amplifier circuits.

In a further embodiment, the multiple differential amplifier circuits of the mode selection amplifier circuit operate simultaneously to generate signal outputs with each differential amplifier circuit generating an output mode selected from one of the algebraic combinations of the signal inputs A–C, B–C, A–B and (A+B)/2–C. The signal outputs of the multiple differential amplifier circuits are coupled to a switching circuit that selectively passes the signal output of each of the differential amplifier circuits. The selected signal output of the switching circuit is coupled to the output amplifier for generating an output signal representative of the selected output mode of the differential amplifier circuits.

The preferred embodiment mode selection amplifier circuit includes a mode switch having multiple differential amplifier circuits coupled to receive at least two of input signals A, B and C. Each differential amplifier circuit generates a signal output representative of an output mode with the output mode of each differential amplifier circuit selected from one of algebraic combinations of the signal inputs A–C, B–C, A–B and (A+B)/2–C. Each differential amplifier circuit is selectively coupled to at least a first constant current sources via the switching circuit. Each output is coupled to one of the multiple differential amplifier circuits. First and second level shifters are coupled to receive the signal output from the mode switch and generate a level shifted signal output. A output amplifier receives the level shifted signal output and generates a output signal equivalent to and representative of the output mode of the selected differential amplifier circuit. The output amplifier may generate a differential or single ended output signal equivalent to and representative of the selected output mode of the differential amplifier circuits.

The mode selection amplifier circuit may be incorporated into a signal acquisition probe having a probe head coupled to a probe control box via a probe cable. The probe head has probing contacts for receiving signal inputs A, B and C. The signal inputs are coupled to the mode selection amplifier circuit generating a signal output representative of the various output modes selected from one of algebraic combinations of the signal inputs A–C, B–C, A–B and (A+B)/2–C. The signal output from the mode selection amplifier circuit is coupled to first and second level shifters for generating a level shifted signal output. The level shifted signal output is coupled to a differential output amplifier which generates a differential output signal. The differential output amplifier may be configured as a single ended output amplifier with the single ended output signal being equivalent to and representative of the various output modes selected from one of algebraic combinations of the signal inputs A–C, B–C, A–B and (A+B)/2–C. The probe control box receives the differential or single ended output signal via the probe cable which has one or more coaxial signal lines, communications line and voltage lines. The probe control box has probe circuitry and a controller with the controller coupled to the probe circuit and the probe head. The controller provides control signals to the probe circuitry, and to the probe head via the communications lines for selectively operating each of the differential amplifier circuits of the mode selection amplifier circuit. The probe control box also couples voltage power to the probe head via the probe cable voltage lines.

The objects, advantages and novel features of the present invention are apparent from the following detailed description when read in conjunction with appended claims and attached drawings.

BRIEF DESCRIPTION OF THE DRAWINGS

FIG. 2 is a further embodiment of the mode selection amplifier circuit for generating multiple signal output modes.

DETAILED DESCRIPTION OF THE INVENTION

Figure 1:
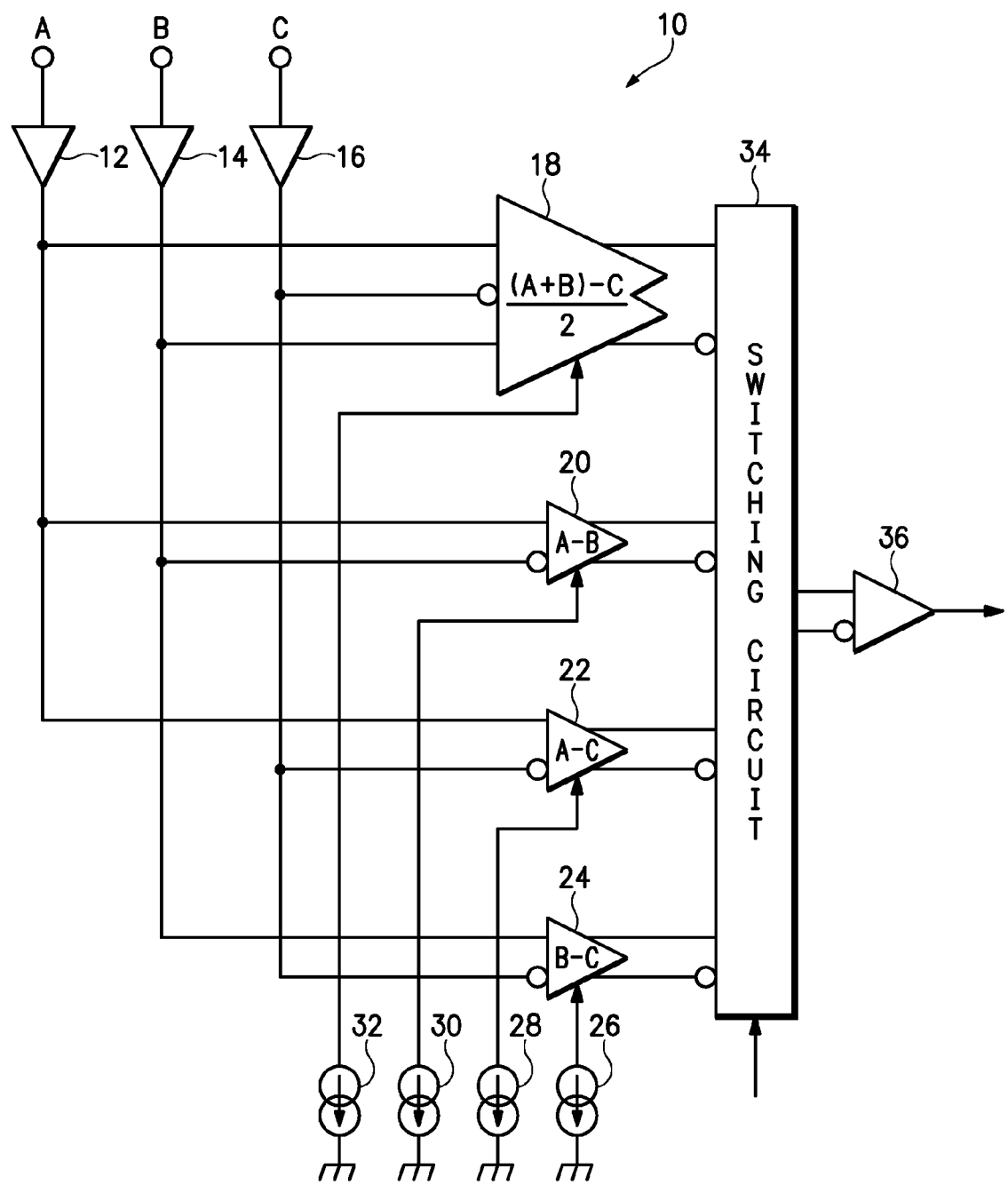
FIG. 1 is a first embodiment of the mode selection amplifier circuit for generating multiple signal output modes.

Referring to FIG. 1, there is shown a first embodiment of the mode selection amplifier circuit 10 for generating multiple signal output modes. The mode selection amplifier circuit 10 has inputs A, B, and C receiving voltage or current input signals A, B and C. The input signals may be single ended, represented by input signals A and C or input signals B and C, or differential, represented by input signals A and B, with the differential signal having common-mode components. The input signals A, B and C are coupled through buffer circuits 12, 14, and 16 to various inputs of differential amplifiers 18, 20, 22 and 24. Each differential amplifier 18, 20, 22 and 24 is coupled to a constant current source 26, 28, 30 and 32. Alternately, the differential amplifiers 18, 20, 22 and 24 may be coupled to a single current source having multiple current outputs. The differential outputs of each of the differential amplifiers 18, 20 22 and 24 are coupled to a switching circuit 34. The switching circuit 34 receives an input for selectively coupling the differential output of each of the differential amplifiers 18, 20, 22 and 24 to an output amplifier 36. The output amplifier 36 generates a output that is coupled to additional electrical circuitry, such as input signal channel circuitry of an oscilloscope.

The switching circuit 34 may be implemented as a multiplexer receiving serial data commands or logic signals for selectively coupling the differential output of each of the differential amplifiers 18, 20, 22 and 24 to the output amplifier 36. Alternately, the switching circuit 34 may be configured with electronic relays that selectively couple the differential output of each of the differential amplifiers 18, 20, 22 and 24 to the output amplifier 36. The switching circuit 34 may also be configured with ganged mechanical switches that are manually switched to selectively couple the differential output of each of the differential amplifiers 18, 20, 22 and 24 to the output amplifier 36. Other switching configurations may be used with the mode selection amplifier circuit 10 without departing from the scope of the present invention as set forth in the appended claims.

Each differential amplifier 18, 20 22 and 24 is coupled to receive at least two of input signals A, B and C. A differential signal having input signals A and B is coupled to the inputs of differential amplifiers 18 and 20. Differential amplifier 18 is also coupled to receive the signal input C, where C may be a signal, but is usually a voltage, such as signal ground. Differential amplifier 22 receives signal inputs A and C where signal C is associated with input signal A. Differential amplifier 24 receives signal inputs B and C where C is associated with input signal B. Input signals A and B may be associated with a differential signal or may be single ended voltage signals associated with input signal C where input signal C is signal ground.

Differential amplifier 18 is configured as a pair of differential amplifiers with the input signal C coupled to one of the inputs of each differential amplifier and differential input signals A and B coupled to the other input of each respective differential amplifier. Each differential amplifier has a gain of 0.5 with the positive outputs of each differential amplifier coupled together and the negative outputs of each differential amplifier coupled together. The resulting signal output of the differential amplifier 18 is a differential signal representative of an output mode is equal to (A+B)/2−C.

Differential input signals A and B are coupled to the respective differential inputs of the differential amplifier 20. The differential amplifier 20 functions to take the difference between input signals A and B with the resulting signal output of the differential amplifier 20 being a differential signal representative of an output mode equal to (A−B). Differential amplifier 22 receives a single ended input signal A and input signal C associated with input signal A. The differential amplifier 22 functions to take the difference between the single ended input signal A and input signal C with the resulting signal output of the differential amplifier 22 being a differential signal representative of an output mode equal to (A−C). Differential amplifier 24 receives a single ended input signal B and input signal C associated with input signal B. The differential amplifier 24 functions to take the difference between the single ended input signal B and input signal C with the resulting signal output of the differential amplifier 24 being a differential signal representative of an output mode equal to (B−C).

The output modes of each of the differential amplifiers 18, 20, 22 and 24 are coupled to the switching circuit 34. The switching circuit 34, in response to a signal command or logic signals where the switching circuit is a multiplexer or electronic relays, or manually switching a ganged switch, selectively couples one of the output modes of the differential amplifiers 18, 20, 22 and 24 to the output amplifier 36. The output amplifier 36 converts the differential signal output to a single ended output signal. The signal ended output signal is representative of one of the output modes (A+B)/2−C, (A−B), (A−C) and (B−C).

FIG. 2 illustrates a further embodiment of the mode selection amplifier circuit 10 for generating multiple signal output modes. Like elements from the previous drawing are labeled the same in FIG. 2. The input signals A, B and C are coupled to various inputs of the differential amplifiers as previously described. The function of each of the differential amplifiers 18, 20, 22 and 24 are the same as previously described with differential amplifier 18 signal output representative of the output mode equal to (A+B)/2−C, differential amplifier 20 signal output representative of the output mode equal to (A−B), differential amplifier 22 signal output representative of the output mode equal to (A−C) and differential amplifier 24 signal output representative of the output mode equal to (B−C). Each differential amplifier 18, 20, 22 and 24 is selectively coupled to a constant current source 40 via a switching circuit 42. The switching circuit 34 is preferably a demultiplexer receiving logic levels or serial data command signals for selectively coupling the current source 40 to each of the differential amplifiers 18, 20, 22 and 24. Alternately, the switching circuit 34 may be configured with electronic relays that selectively couple the constant current source to each of the differential amplifiers 18, 20, 22 and 24. The switching circuit 34 may also be configured with ganged mechanical switches that are manually switched to selectively couple the constant current source to each of the differential amplifiers 18, 20, 22 and 24. The switching circuit 42 selectively couples the constant current source 40 to each of the differential amplifiers 18, 20, 22 and 24 which causes the selected differential amplifier to operate while keeping the other differential amplifiers inoperative. The output of the operating differential amplifier is coupled to the summing circuit 44 which sums the signal output with the signal outputs of the other differential amplifiers. Since the other differential amplifiers are inoperative and are not producing a signal output, the signal output of the operative differential amplifier is summed with zero outputs of the other differential amplifiers. The summed signal output of the summing circuit 44 is coupled to the inputs of output amplifier 36.

Figures 3, 4:
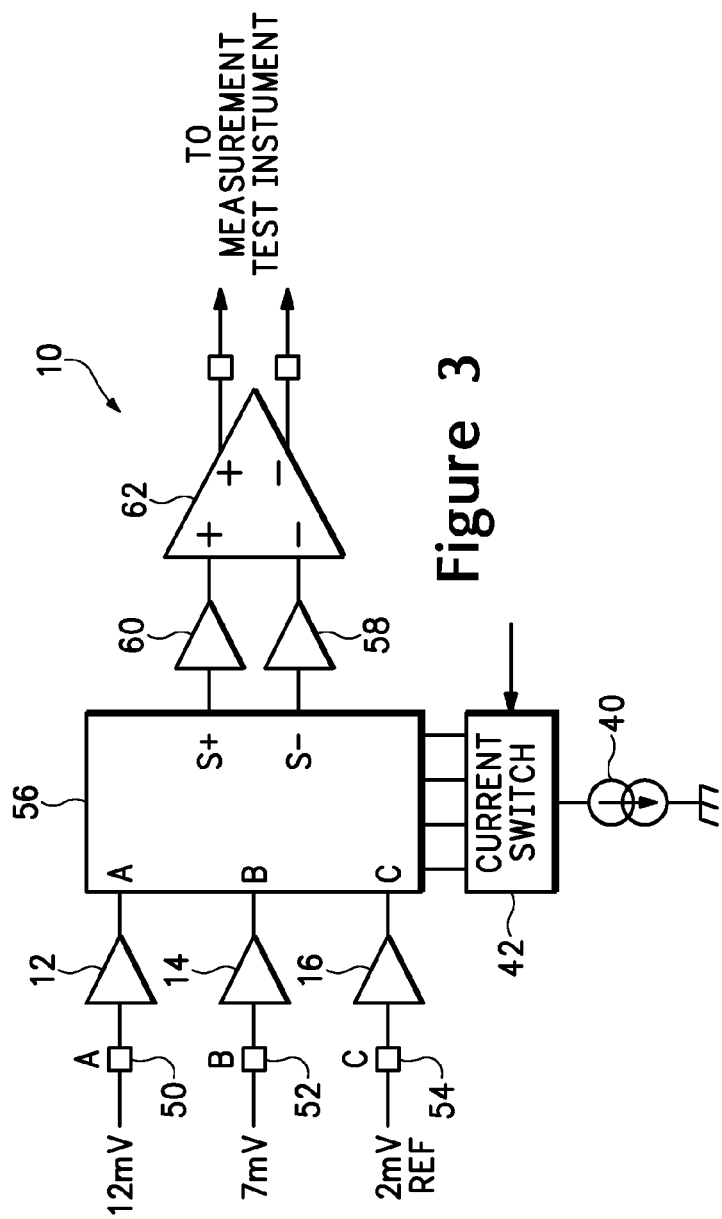
FIG. 3 is a third embodiment of the mode selection amplifier circuit for generating multiple signal output modes.
FIG. 4 is a table illustrating an example of signals entering and exiting the mode selection amplifier circuit.

FIG. 3 illustrates another embodiment of the mode selection amplifier circuit 10 for generating multiple signal output modes. Like elements from the previous drawings are labeled the same in FIG. 3. The mode selection amplifier circuit 10 is preferably implemented in an application specific integrated circuit (ASIC) where the ASIC is mounted on a substrate, and coupled to other circuit elements by contact pads formed on the substrate. The input signals A, B and C are coupled to mode selection amplifier circuit 10 via contact pads 50, 52, and 54. The input signals A, B, and C are coupled via buffer circuits 12, 14, and 16 to mode switch 56. The mode switch 56 contains the differential amplifiers 18, 20, 22 and 24. The mode switch 56 receives a current signal from a constant current source 40 via switching circuit 42. The switching circuit 42 functions a previously described to selectively couple the constant current source to one of the differential amplifies 18, 20 22 and 24 in the mode switch 56. Whereas in the embodiment of FIG. 2, the signal outputs of the differential amplifiers 18, 20 22 and 24 are coupled to the summing circuit 44, the signal outputs of the differential amplifiers 18, 20, 22 and 24 are coupled together in the ASIC with the result that the mode switch 56 has a single differential output with the differential output being one of the output modes ((A+B)/2−C), (A−B), (A−C) and (B−C) of the differential amplifiers 18, 20, 22 and 24. The differential output of the mode switch 56 is coupled through signal leveling buffer amplifiers 58 and 60 and applied to the differential inputs of differential output amplifier 62. The differential output signal from the differential amplifier 62 may be coupled to input signal channel circuitry of a measurement test instrument, such as an oscilloscope. The differential output amplifier 62 may also be configured to generate a single end output signal. In such a configuration, the differential output amplifier 62 has a gain of 2 which allows the negative differential output of the amplifier 62 to be grounded through a termination resistor 64 while still providing an output signal having the correct output signal modes ((A+B)/2−C), (A−B), (A−C) and (B−C). The value of the termination resistor 64 is set to correspond to the input termination of the input signal channel circuitry.

Referring to FIG. 4, there is shown a table illustrating an example of signals entering and exiting the mode selection amplifier circuit 10 of FIG. 3. To illustrate, input signal A has a voltage of 12 mV, input signal B has a voltage of 7 mV, and input signal C has a voltage of 2 mV. The switch logic for current switch 42 is shown in the switch logic column where a 0,0 logic input to the current switch 42 enables differential amplifier 20 which operates in mode (A−B) as shown in the mode column. A 1,0 logic input to the current switch 42 enables differential amplifier 22 which operates in mode (A−C). A 0,1 logic input to the current switch 42 enables differential amplifier 24 which operates in mode (B−C). A 1,1 logic input to the current switch 42 enables differential amplifier 18 which operates in mode ((A+B)/2−C). The differential output signal at outputs S+ and S− of the mode switch 56 is 5 mV for the differential amplifier 20 derived from the 12 mV input signal A minus the 7 mV input signal B. The differential output signal at outputs S+ and S− for the differential amplifier 22 is 10 mV derived from the 12 mV input signal A minus the 2 mV input signal C. The differential output signal at outputs S+ and S− for the differential amplifier 24 is 5 mV derived from the 7 mV input signal B minus the 2 mV input signal C. The differential output signal at outputs S+ and S− for the differential amplifier 18 is 7.5 mV derived from the summation of the 12 mV input signal A and the 7 mV input signal B divided by 2 minus the 2 mV input signal C. The various differential outputs of the mode switch 56 are level shifted by the signal level buffer amplifiers 58 and 60 such that the differential inputs to the amplifier 62 in the (A–B) mode is +2.5 mV and –2.5 mV, +5 mV and –5 mV in the (A–C) mode, +2.5 mV and –2.5 mn in the (B–C) mode, and +3.75 mV and –3.75 mV in the ((A+B)/2–C) mode. As previously stated, the output amplifier 62 may be single ended where the differential amplifier 62 has a gain of two with the minus output of the amplifier ground through termination resistor 64. The plus outputs of the differential signals for the various output signal modes are multiplied by the gain of the amplifier 62 generate output signals that match the differential outputs from the various differential amplifiers 18, 20, 22 and 24.

Figure 5:
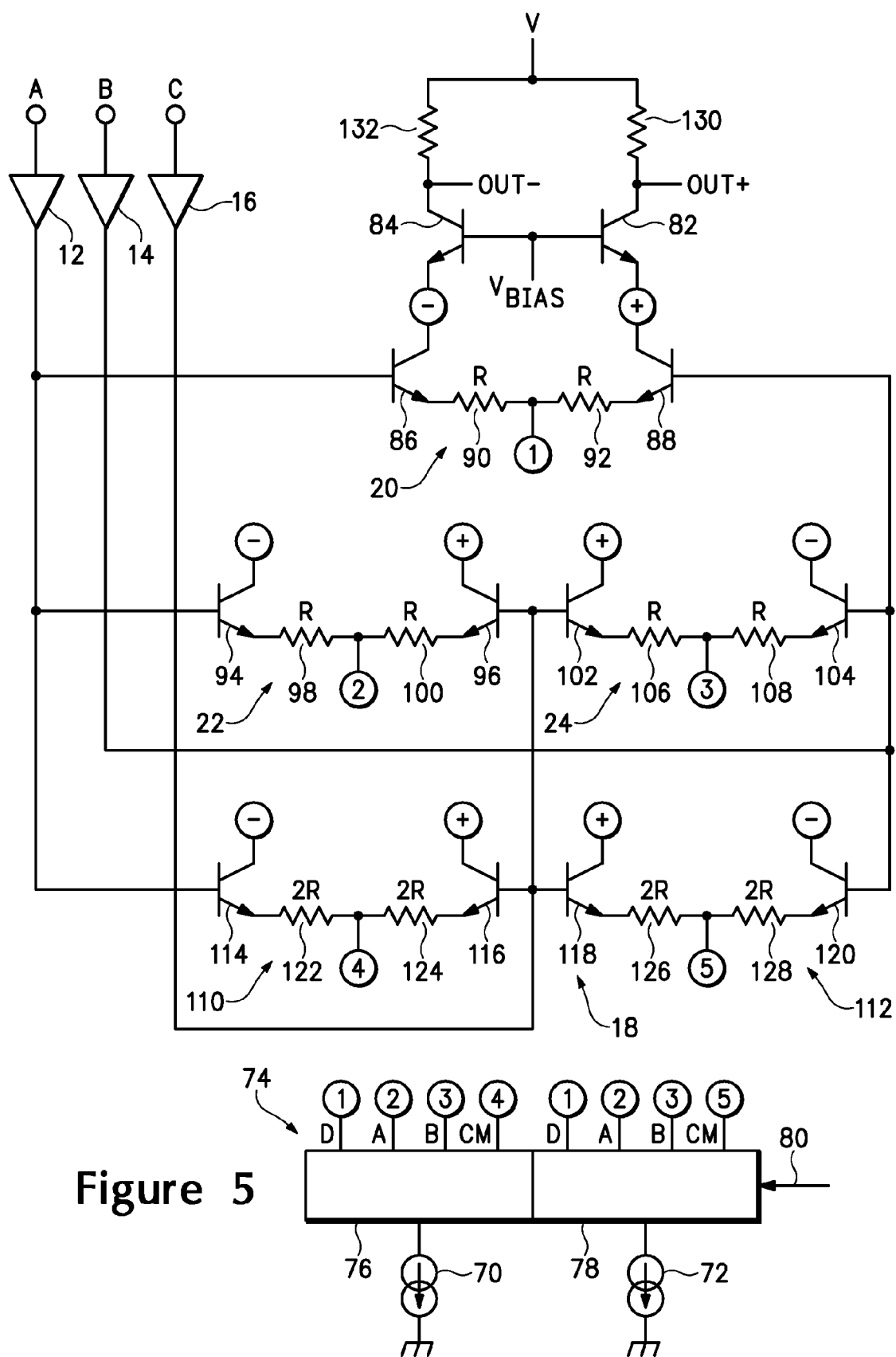
FIG. 5 is a schematic representation of the circuitry in the differential signal mode switch of the mode selection amplifier circuit for generating multiple signal output modes.

Referring to FIG. 5, there is shown a schematic representation of the circuitry in the mode switch 56. Like elements from the previous drawings are labeled the same in FIG. 5. The input signals A, B, and C are coupled through buffer circuits 12, 14, and 16 to various base inputs of differential transistor pairs. Source currents to drive the differential transistor pairs are provided by first and second constant current sources 70 and 72 coupled to a switch matrix 74. The switch matrix 74 has dual switching elements 76 and 78 with each constant current source 70 and 72 coupled to one of the switching elements 76 and 78. Each switch element 76 and 78 has multiple outputs, respectively labels 1, 2, 3, and 4 for switching element 76 and 1, 2, 3, and 5 for switching element 78, for coupling the constant current sources 70 and 72 to the differential transistor pairs. Control signals are coupled to the switch matrix 74 via signal input line 80. The control signals are logic levels as described with respect to FIG. 4 that cause the switching elements 76 and 78 to selectively couple the constant current sources to the various differential transistor pairs. The plus collector outputs "+" of the differential transistor pairs are coupled together prior to the emitter of the plus output transistor 82. Likewise, the minus collector outputs "−" of the differential transistor pairs are coupled together prior to the emitter of the minus output transistor 84. The collectors of plus output transistor 82 and minus output transistor 84 are coupled to a common voltage source V via respective collector resistors 130 and 132. The bases of plus output transistor 82 and minus output transistor 84 are commonly coupled together to a voltage bias.

The differential transistor pair 86 and 88 for the differential amplifier 20 have their emitters coupled to the constant current sources 70 and 72 via matched resistance value resistors 90 and 92. The resistor values are chosen to produce a gain of 1 at the outputs of the transistor pairs 86 and 88. The base of transistor 86 is coupled to receive input signal A of a differential input signal and the base of transistor 88 is coupled to receive input signal B of the differential input signal. Since the differential transistor pair is coupled to the constant current sources 70 and 72, a voltage difference between the A and B signal components will cause more current to flow in one transistor than the other. The result is an differential output signal on the collectors of output transistors 82 and 84 that is the difference between the input signal A and the input signal B.

The differential transistor pair 94 and 96 for the differential amplifier 22 have their emitters coupled to the constant current sources by matched resistance value resistors 98 and 100. As with the differential transistor pair 86 and 88, the resistor values are chosen to produce a gain of 1 at the outputs of the differential transistor pair 94 and 96. The base of transistor 94 is coupled to receive input signal A of a single ended voltage signal and the base of transistor 96 is coupled to receive input signal C which is a reference signal, generally electrical ground, associated with the input signal A. The differential transistor pair 94 and 96 are coupled to the constant current sources 70 and 72 resulting in more current flowing in transistor 94 if the input signal A is not at the same level as input signal C. The result is a differential signal output on the collectors of output transistors 82 and 84 that is the difference between the input signal A and the input signal C.

The differential transistor pair 102 and 104 for the differential amplifier 24 have their emitter coupled to the constant current sources 70 and 72 by matched resistance value resistors 106 and 108. The differential transistor pair 102 and 104 have the same gain as the previously described differential transistor pairs 86, 88 and 94, 96 and operate in essentially the same manner as differential transistor pair 94 and 96 with the exception that the base of transistor 104 is coupled to receive input signal B of a single ended voltage signal and the base of transistor 104 is coupled to receive input signal C which is a reference signal, generally electrical ground associated with input signal B. The result of the differential transistor pair 102 and 104 operation is differential output signal on the collectors of output transistors 82 and 84 that is the difference between the input signal B and the input signal C.

As previously described, differential amplifier 18 is configured as a pair of differential amplifiers 110 and 112 with the input signal C coupled to one of the inputs of each differential amplifier and differential input signals A and B coupled to the other input of each respective differential amplifier 110 and 112. The circuit topology of differential amplifiers 110 and 112 are the same with the emitters of differential transistor pair 114 and 116 of differential amplifier 110 and the emitters of differential transistor pair 118 and 120 differential amplifier 112 coupled to matched resistor value resistors 122, 124, 126 and 128. The resistor values for each of these resistors is twice that of the resistor values of the other differential transistor pairs resulting in a gain for differential transistor pairs 114, 116 and 118, 120 of 0.5. The junction point between resistors 122 and 124 of the differential transistor pair 114 and 116 is coupled to current source 70 via the switching element 78 of the switch matrix 74. The junction point between resistors 126 and 128 of differential transistor pair 118 and 120 is coupled to the current source 72 via the switching element 78 of the switch matrix 74. The bases of transistors 116 and 118 of the differential transistor pairs 114, 116 and 118, 120 are coupled to receive the input signal C. Input signal C may be signal ground or some voltage level provided by a variable voltage source. The base of transistor 114 of the differential transistor pair 114, 116 is coupled to receive the input signal A of the differential signal and the base of transistor 120 is coupled to receive the input signal B of the differential signal.

The result of the differential transistor pair 114 and 116 operation is a differential output signal out of the collectors of output transistors 114 and 116 that is the difference between the input signal A and the input signal C. The result of the differential transistor pair 114 and 116 operation is a differential output signal out of the collectors of output transistors 120 and 118 that is the difference between the input signal B and the input signal C. The output out of the collectors of transistors 116 and 118 are added together as well as the outputs out of the collectors of transistors 114 and 120. The result of the combined transistor pairs 114, 116 and 118, 120 is a differential output signal on the collectors of the output transistors 82 and 84 that is the sum of the input signals A and B with one-half the gain as the other differential transistor pairs 86 and 88, 94 and 96, 102 and 104 minus the input signal C.

Figure 6:
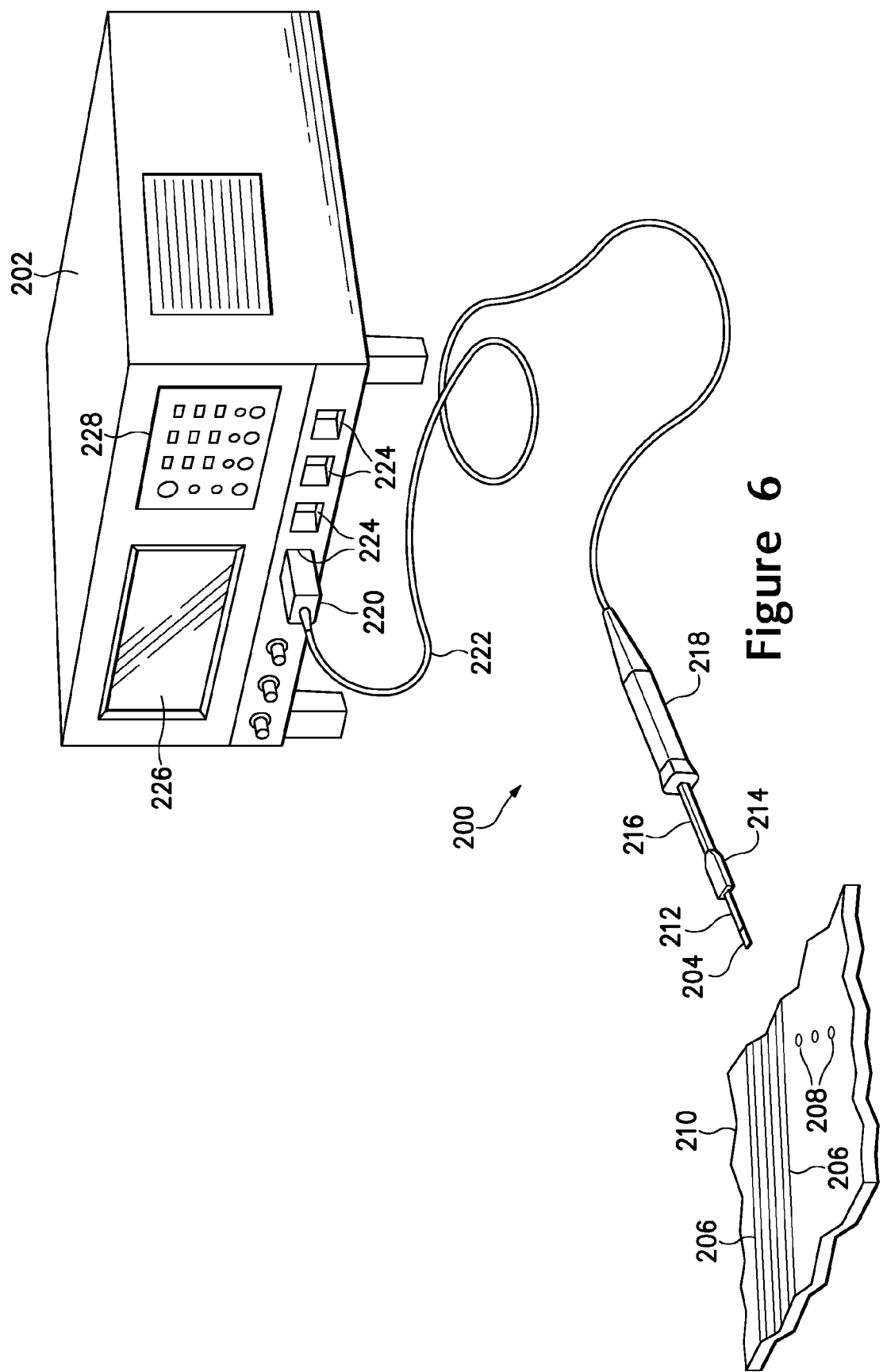
FIG. 6 is a perspective view of a signal acquisition probe for use with the mode selection amplifier circuit.

Referring to FIG. 6, there is shown a perspective view of a signal acquisition probe 200 usable with the mode selection amplifier circuit 10. The signal acquisition probe 200 is coupled to a measurement test instrument 202, such as an oscilloscope, logic analyzer or the like. The signal acquisition probe 200 has probing contacts 204 for electrically contacting circuit traces 206 or contact points 208 on a device under test 210. The probing contacts are mounted to flexible substrates 212 that are attached to a probing tip member 214. Electrical circuitry within the probing tip member 214 is electrically coupled to coaxial signal cables 216. Each of the coaxial signal cables 216 has a central signal conductor surrounded by an outer shielding conductor. The coaxial signal cables 216 are terminated in a probing head 218 in which is disposed the mode selection amplifier circuit 10 and associated circuitry. The probe head is coupled to a probe control box 220 via a probe cable 222. The probe cable 222 preferably includes at least a first coaxial signal cable having a central signal conductor and an outer shielding conductor, communications lines and voltage power lines. The control box 220 has a controller with on-board memory or separate memory, and probe circuitry. The control box 220 is coupled to the measurement test instrument 202 via one of multiple instrument interfaces 224 that are coupled to input signal channel circuitry within the measurement test instrument 202. The measurement test instrument 202 preferably has a display device 226 on which is displayed an input signal from a device under test. The measurement test instrument 202 includes front panel controls 228, such as rotatable knobs, push buttons and the like for controlling the settings of the instrument. Alternatively, the front panel controls may be graphically generated and displayed on the display device 226 and controllable by the user. Each instrument interface 224 has at least a first coaxial signal connector and voltage power and communications bus contacts.

Figure 7A:
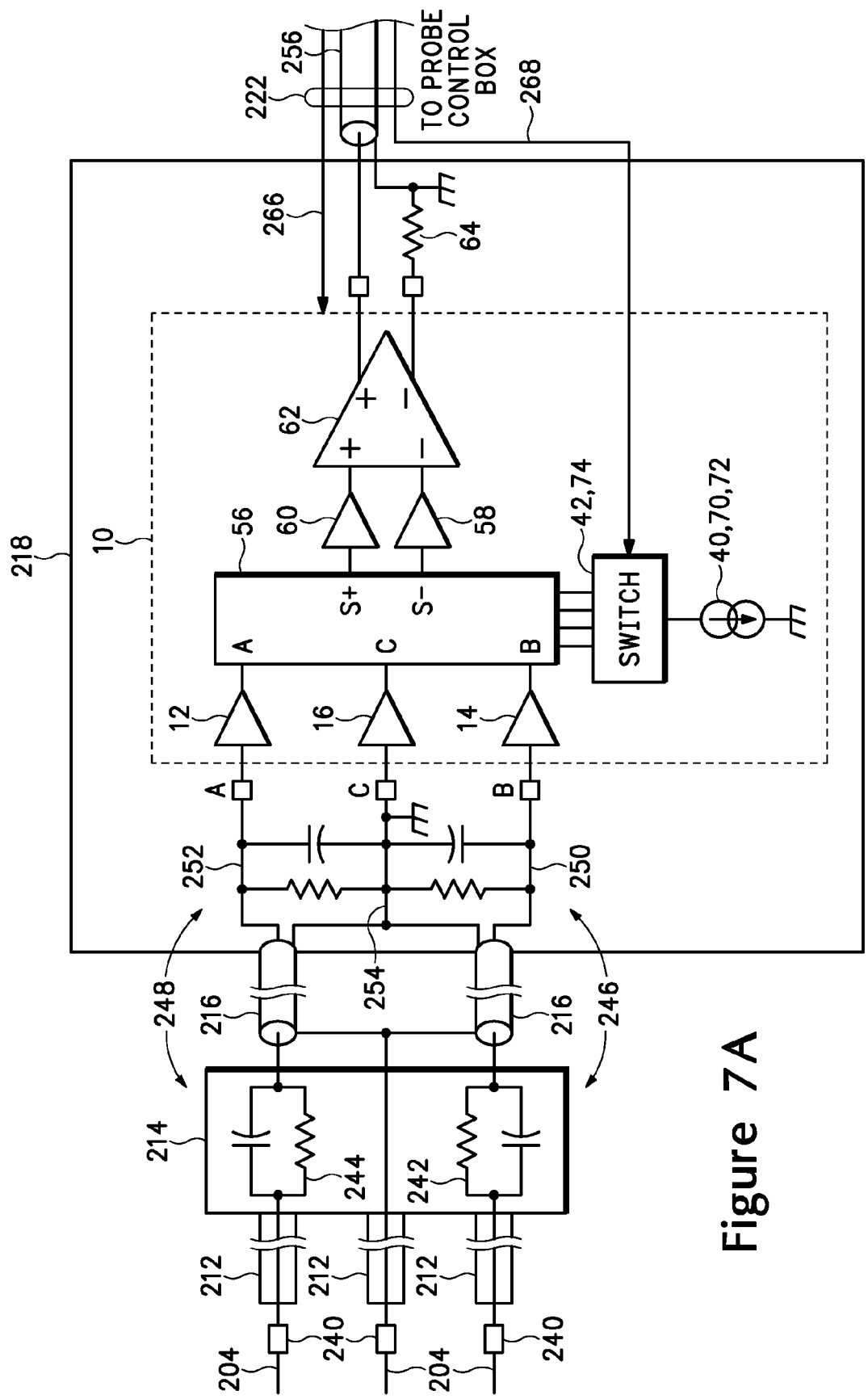
FIGS. 7A and 7B are schematic block diagrams of the signal acquisition probe with the mode selection amplifier circuit.
Figure 7B:
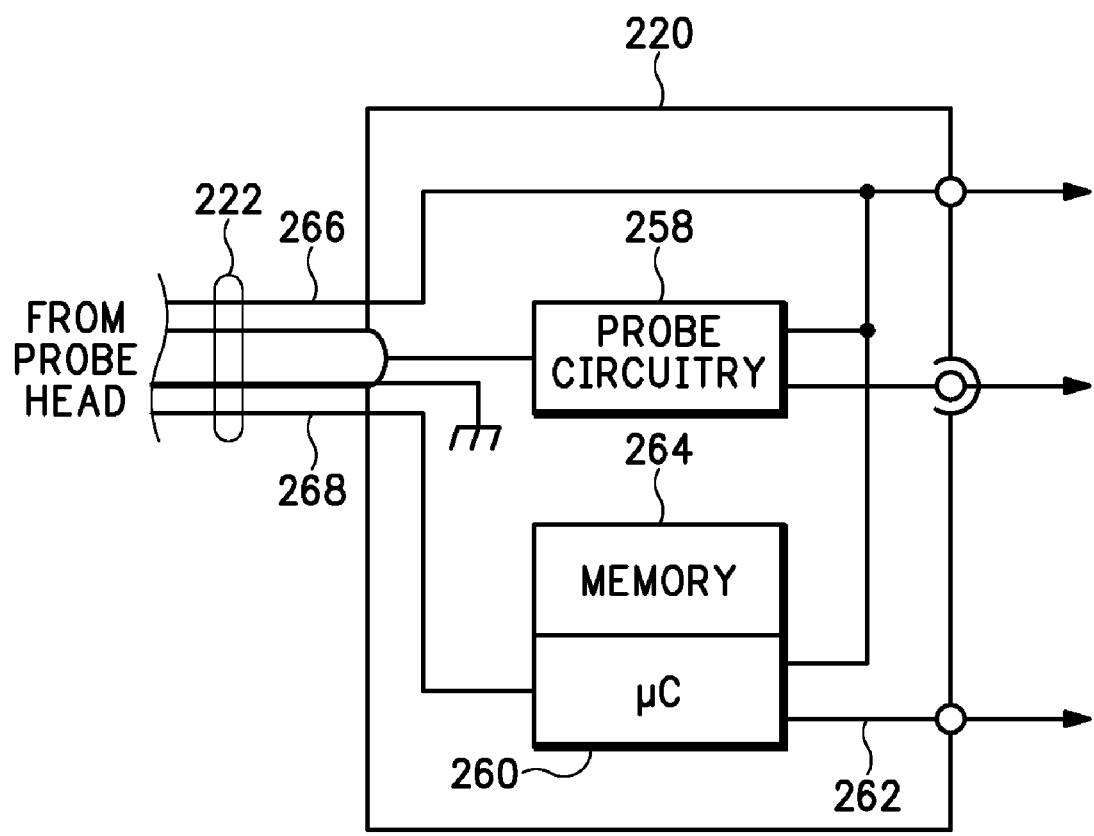

Referring to FIGS. 7A and 7B, there is shown a schematic block diagram of the signal acquisition probe 200. Like elements from the previous drawing are labeled the same in FIGS. 7A and 7B. The probing contacts 204 are leads extending from damping impedance resistors 240. The probing contacts 204 acquire the signal inputs A, B, and C. The leads extending from the other end of resistors 240 are connected to the flexible substrates 212 and electrically coupled to circuit traces on the flexible substrates 212. Two of the circuit traces for coupling to input signals A and B are coupled to first portions 242, 244 of resistive-capacitive voltage divider networks 246 and 248 disposed in the probing tip member 214. The second portions 250, 252 of the resistive-capacitive voltage divider networks 246 and 248 are disposed in the probe head 218 and are electrically coupled to the first resistive-capacitive voltage divider network portions 242, 244 via the coaxial signal cables 216. The other circuit trace for coupling the input signal C is coupled to electrical ground via the outer shielding conductors of the coaxial signal cables 216. A circuit trace 254 is provided in the probe head 218 that is coupled to outer shielding conductors of the coaxial signal cables 216.

The junctions between the first and second portions 242, 250 and 244, 252 of the resistive-capacitive voltage divider networks 246 and 248 and the grounded circuit trace 254 are respectively coupled to the buffer circuits 12, 14 and 16 of the mode selection amplifier circuit 10. The output of the buffer circuits 12, 14, and 16 are coupled to the respective A, B and C signal inputs of the mode switch 56. The differential signal outputs S+ and S− of the mode switch 56 are respectively coupled to the signal leveling buffer amplifiers 58 and 60. The outputs of the buffer amplifiers 58 and 60 are coupled to the differential inputs of output differential amplifier 62. The plus differential output of the output differential amplifier 62 is coupled to the central signal conductor of coaxial signal cable 256. The central signal conductor of the coaxial signal cable 256 is coupled to probe circuitry 258 in the probe control box 220 as shown in FIG. 7B. The probe circuitry 258 may include gain switching circuits, attenuator circuits, probe offset circuits and the like that are controlled by controller 260. The controller 260 communicates with the measurement test instrument 202 via a serial communications bus 262 coupled to the instrument interface 224. The communications bus 262 allows requests to be made to the measurement test instrument 202 by the controller 260 and command signals to be communicated from the measurement test instrument 202 to the controller 260. The communications bus 262 further allows the transfer of probe data stored in memory 264 to the measurement test instrument 202. The probe control box 220 also receives voltage power from the measurement test instrument 202 via the instrument interface 224. The voltage power is provided to the probe circuitry 258, the controller 260, memory 262 and the mode selection amplifier circuit 10 in the probe head 218 via voltage lines 266 in the probe cable 222. The controller 260 communicates with the mode selection amplifier circuit 10 via communications lines 268 disposed in the probe cable 222. The communications lines 268 may be a two line serial communications line, such as an I$^2$C bus or the like, or two logic lines that provide logic levels to the current switch 42 or the switch matrix 74. As previously described, the current switch 42 selectively couples the current source 40 or currents source 70 and 72 to differential amplifiers 18, 20, 22 and 24 in response to the logic levels provided from the controller over the communications lines 268.

Selection of the various signal outputs representative of the output modes A−C, B−C, A−B and (A+B)/2−C may be implemented in a number of ways. For example, buttons may mounted on the probe control box 220 that are assigned for each output mode. The buttons are coupled to contact switches that when activated provide a request to the controller 260 in the switch control box 220. Each request is interpreted by the controller 260 and the appropriate logic levels or logic level commands are coupled to the current switch 42, 74 for turning on the differential amplifier 18, 20, 22 and 24 corresponding to the button that was pressed. Alternately, the measurement test instrument 202 may have a user interface that is displayed on the display device 226 displaying the various output modes. A user selects the one of the output modes by using the front panel controls 228 or touching the display device 226 if the display device 226 is a touch screen device. A controller in the measurement test instrument 202 interprets the selection and generates command instructions that are coupled via the serial communications bus 262 to the controller 260 in the probe control box 220. The controller 260 interprets the command instructions and generates the appropriate logic levels or logic level commands that are coupled to the current switch 42, 74 for turning on the differential amplifier 18, 20, 22 and 24 corresponding to the output mode selected by the user.

Figure 8:
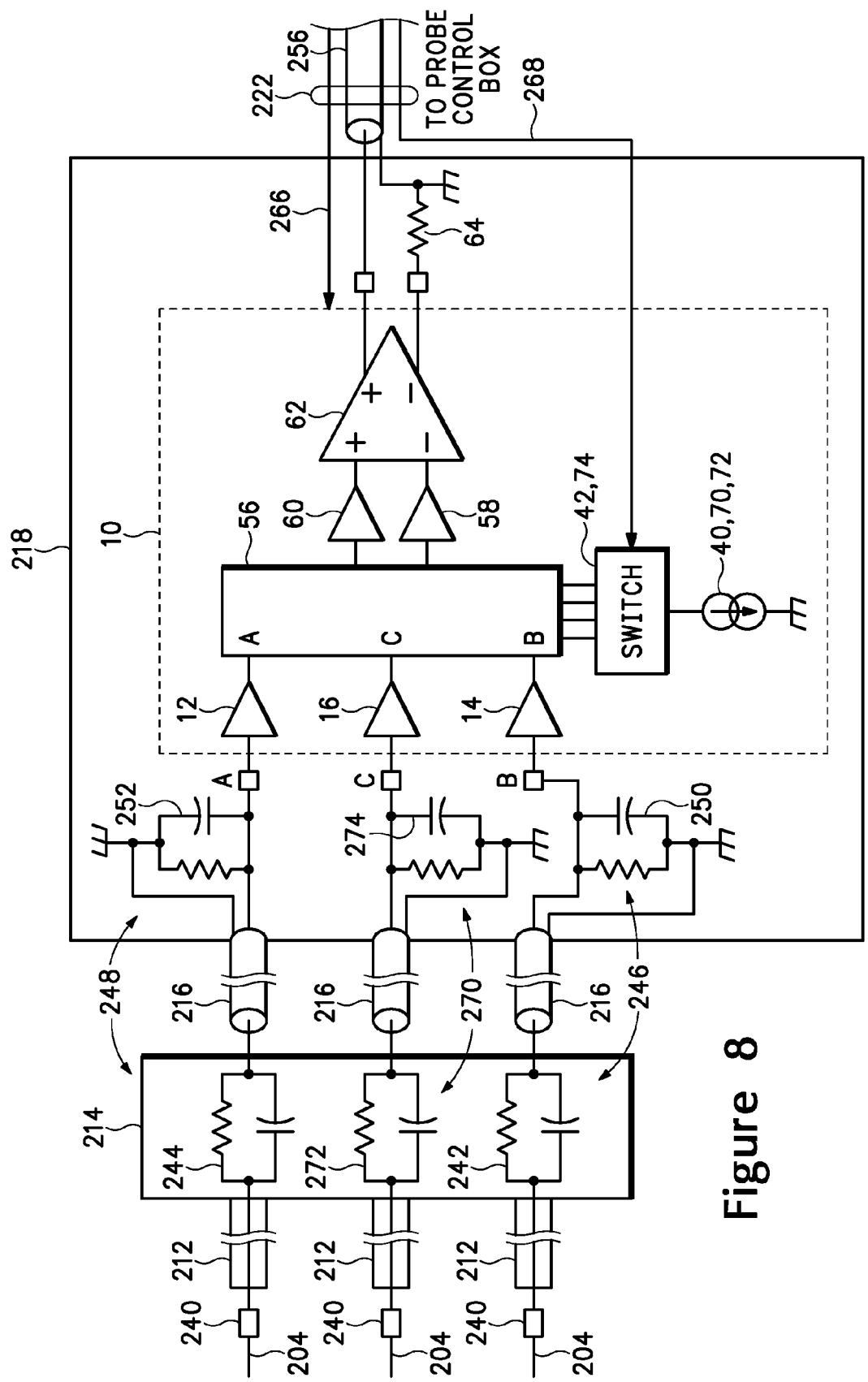
FIG. 8 is a schematic block diagram an alternative probe head configuration of the signal acquisition probe with the mode selection amplifier circuit.

Referring to FIG. 8 there is shown a schematic block diagram an alternative probe head configuration of the signal acquisition probe 200 with the mode selection amplifier circuit 10. Like elements from the previous drawing are labeled the same in FIG. 8. The overall topology and operation of the signal acquisition probe 200 in FIG. 8 is similar to the probe in FIGS. 7A and 7B with the exception of the circuitry associated with acquiring the input signal C. Instead of coupling the probing tip 204 designated for acquiring the input signal C to ground as in FIG. 7A, the probing tip is now coupled to resistive-capacitive voltage divider network 270. The resistive-capacitive voltage divider network 270 has the same topology as the resistive-capacitive voltage divider networks 246 and 248 in that the voltage divider network 270 has a first portion 272 coupled to the conductive trace of the input signal C input. The second portion 274 of the resistive-capacitive voltage divider network 270 is disposed in the probe head 218 and is coupled to the first portion 272 via another coaxial signal conductor 216. The junction of the first and second portions 272 and 274 of the resistive-capacitive voltage divider network 270 is coupled to the buffer circuit 16 of the mode selection amplifier circuit 10. The signal acquisition probe 200 of FIG. 8 is capable of receiving a reference potential on the input signal C. The input signal C reference potential may be a user or signal standard requirement requiring a non-grounded input signal C.

As previously stated, the differential output signal from the differential amplifier 62 may be coupled to the measurement test instrument 202. In such a configuration, the probe cable 222 has first and second coaxial signal cables with the central signal conductors of the coaxial signal cables respectively coupled to the plus and minus outputs of the differential amplifier 62. Each instrument interface 224 of the measurement test instrument 202 and the control box 220 are modified to accept the plus and minus outputs of the differential amplifier 62. The modification may take the form of first and second coaxial signal connectors to each instrument interface 224 and the control box 220.

It will be obvious to those having skill in the art that many changes may be made to the details of the above-described embodiments of this invention without departing from the underlying principles thereof. The scope of the present invention should, therefore, be determined only by the following claims.

What is claimed is:

1. A mode selection amplifier circuit having multiple output modes comprising multiple differential amplifier circuits coupled to receive at least two of signal inputs A, B and C with each differential amplifier circuit selectively operable for generating a signal output representative of an output mode, the output mode of each differential amplifier circuit selected from one of algebraic combinations of the signal inputs A–C, B–C, A–B and (A+B)/2–C.

2. The mode selection amplifier circuit as recited in claim 1 further comprising means for selectively operating each of the multiple differential amplifier circuits independent of the other differential amplifier circuits.

3. The mode selection amplifier circuit as recited in claim 2 wherein the selectively operating means further comprises a switching circuit having an input coupled to at least a first current source and multiple outputs with each output coupled to one of the differential amplifier circuits, the switching circuit selectively coupling the current source to each of the differential amplifier circuits for operating each of the multiple differential amplifier circuits independent of the other differential amplifier circuits.

4. The mode selection amplifier circuit as recited in claim 3 further wherein the switching circuit comprises a demultiplexer.

5. The mode selection amplifier circuit as recited in claim 3 further comprising an output amplifier receiving the selected output mode of each of the differential amplifier circuits and generating an output signal representative of the selected output mode of the differential amplifier circuits.

6. The mode selection amplifier circuit as recited in claim 5 wherein the output amplifier is a differential amplifier generating a differential output signal equivalent to and representative of the signal output mode of the differential amplifier circuits.

7. The mode selection amplifier circuit as recited in claim 6 wherein the differential amplifier has plus and minus differential outputs with the differential amplifier having a gain of two and the minus differential output coupled to electrical ground via a termination resistor for generating a single ended output signal equivalent to and representative of the signal output mode of the differential amplifier circuits.

8. The mode selection amplifier circuit as recited in claim 3 wherein the selectively operating means further comprises a switch matrix having first and second switching elements with each switching element coupled to one of a first and second a constant current sources and having multiple outputs with each output coupled to one of the multiple differential amplifiers.

9. The mode selection amplifier circuit as recited in claim 8 further wherein the switch matrix comprises a demultiplexer.

10. The mode selection amplifier circuit as recited in claim 3 further comprising a summing circuit coupled to receive the output modes of the differential amplifier circuits and generating a summed signal output representing the selected output mode of the differential amplifier circuits.

11. The mode selection amplifier circuit as recited in claim 10 further comprising an output amplifier receiving the summed signal output of the summing circuit and generating an output signal representative of the selected output mode of the differential amplifier circuits.

12. The mode selection amplifier circuit as recited in claim 11 wherein the output amplifier is a differential amplifier generating a differential output signal equivalent to and representative of the selected output mode of the differential amplifier circuits.

13. The mode selection amplifier circuit as recited in claim 11 wherein the differential amplifier has plus and minus differential outputs with the differential amplifier having a gain of two and the minus differential output coupled to electrical ground via a termination resistor for generating a single ended output signal equivalent to and representative of the selected output mode of the differential amplifier circuits.

14. The mode selection amplifier circuit as recited in claim 1 further comprising a switching circuit coupled to the output modes of the differential amplifier circuits for selectively passing the output mode of each of the differential amplifier circuits.

15. The mode selection amplifier circuit as recited in claim 14 further comprising an output amplifier receiving the selected output mode of each of the differential amplifier circuits and generating an output signal representative of the selected output mode of the differential amplifier circuits.

16. The mode selection amplifier circuit as recited in claim 15 wherein the output amplifier is a differential amplifier generating a differential output signal equivalent to and representative of the signal output mode of the differential amplifier circuits.

17. The mode selection amplifier circuit as recited in claim 15 wherein the differential amplifier has plus and minus differential outputs with the differential amplifier having a gain of two and the minus differential output coupled to electrical ground via a termination resistor for generating a single ended output signal equivalent to and representative of the signal output mode of the differential amplifier circuits.

18. A mode selection amplifier circuit having multiple signal output modes comprising;

a mode switch having multiple differential amplifier circuits coupled to receive at least two of signal inputs A, B and C with each differential amplifier circuit generating a signal output representative of an output mode, the output mode of each differential amplifier circuit selected from one of algebraic combinations of the signal inputs A–C, B–C, A–B and (A+B)/2–C;

a switching circuit having an input coupled to at least a first current source and multiple outputs with each output coupled to one of the differential amplifier circuits, the switching circuit receiving control signals from the controller for selectively coupling the source to each of the differential amplifier circuits for operating each of the multiple differential amplifier circuits independent of the other differential amplifier circuits, first and second level shifters coupled to receive the selected output mode from the mode switch and generating a level shifted signal representative of the selected output mode; and an output amplifier receiving the level shifted signal output and generating an output signal, the output signal representative of the output mode of the selected differential amplifier circuit.

19. The mode selection amplifier circuit as recited in claim 18 wherein the switching circuit further comprises a switch matrix having first and second switching elements with each switching element coupled to one of first and second constant current sources and having multiple outputs with each output coupled to one of the multiple differential amplifier circuits for selectively coupling the first and second current sources to each of the differential amplifier circuits.

20. The mode selection amplifier circuit as recited in claim 18 wherein the switching circuit comprises a demultiplexer.

21. The mode selection amplifier circuit as recited in claim 18 wherein the output amplifier is a differential amplifier generating a differential output signal equivalent to and representative of the signal output mode of the differential amplifier circuits.

22. The mode selection amplifier circuit as recited in claim 18 wherein the differential amplifier has plus and minus differential outputs with the differential amplifier having a gain of two and the minus differential output coupled to electrical ground via a termination resistor for generating a single ended output signal equivalent to and representative of the signal output mode of the differential amplifier circuits.

23. A signal acquisition probe comprising:

a probe head having probing contacts for receiving at least two of signal inputs A, B, and C with the signal inputs coupled to a mode selection amplifier circuit having multiple differential amplifier circuits with each differential amplifier circuit selectively operable for generating a signal output representative of an output mode, the output mode of each differential amplifier circuit selected from one of algebraic combinations A–C, B–C, A–B and (A+B)/2–C; and a probe control box coupled to receive signal output via a probe cable having at least a first coaxial signal line, communications line and voltage lines, the probe control box having probe circuitry and a controller with the controller coupled to the probe circuit and the probe head to provide control signals to the probe circuitry and to the probe head via the communications lines for selectively operating each of the differential amplifier circuits of the mode selection amplifier circuit with the probe control box coupling voltage power to the probe head via the probe cable voltage lines.

24. The signal acquisition probe as recited in claim 23 wherein the mode selection amplifier circuit further comprises:

a mode switch having the multiple differential amplifier circuits coupled to receive at least two of signal inputs A, B and C and generating the signal output representative of the respective output modes of the multiple differential amplifier circuits;

a switching circuit having an input coupled to at least a first current source and multiple outputs with each output coupled to one of the differential amplifier circuits, the switching circuit receiving control signals from the controller for selectively coupling the source to each of the differential amplifier circuits for operating each of the multiple differential amplifier circuits independent of the other differential amplifier circuits;

first and second level shifters coupled to receive the selected output mode from the mode switch and generating a level shifted signal output representative of the selected output mode;

an output amplifier receiving the level shifted signal output and generating an output signal, the output signal representative of the output mode of the selected differential amplifier circuit.

25. The mode selection amplifier circuit as recited in claim 24 wherein the switching circuit further comprises a switch matrix having first and second switching elements with each switching element coupled to one of first and second constant current sources and having multiple outputs with each output coupled to one of the multiple differential amplifier circuits for selectively coupling the first and second current sources to each of the differential amplifier circuits.

26. The signal acquisition probe as recited in claim 24 wherein the output amplifier is a differential amplifier generating a differential output signal equivalent to and representative of the signal output mode of the differential amplifier circuits.

27. The signal acquisition probe as recited in claim 24 wherein the differential amplifier has plus and minus differential outputs with the differential amplifier having a gain of two and the minus differential output coupled to electrical ground via a termination resistor for generating a single ended output signal equivalent to and representative of the signal output mode of the differential amplifier circuits.

28. The signal acquisition probe as recited in claim 26 wherein the probe cable having first and second coaxial signal line for coupling the differential output signal to the control box.

* * * * *